US006580294B1

United States Patent
Fletcher

(10) Patent No.: US 6,580,294 B1
(45) Date of Patent: Jun. 17, 2003

(54) ZIPPER DOMINO CARRY GENERATE CELL FOR FAST ADDERS

(75) Inventor: Thomas D. Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/020,446

(22) Filed: Dec. 18, 2001

(51) Int. Cl.[7] ............................................. H03K 19/096
(52) U.S. Cl. .............................. 326/98; 326/95; 326/93; 327/208
(58) Field of Search ............................ 326/93, 95, 98; 327/208–212, 214, 215, 224, 225

(56) References Cited

U.S. PATENT DOCUMENTS

| 5,384,493 A | * | 1/1995 | Furuki ........................ 327/203 |
| 5,777,491 A | * | 7/1998 | Hwang et al. ............... 326/113 |
| 5,847,984 A | | 12/1998 | Mahurin |
| 6,133,761 A | * | 10/2000 | Matsubara .................. 326/112 |
| 6,205,463 B1 | | 3/2001 | Manglore et al. |
| 6,316,960 B2 | | 11/2001 | Ye |

\* cited by examiner

Primary Examiner—Michael Tokar
Assistant Examiner—Vibol Tan
(74) Attorney, Agent, or Firm—Kenyon & Kenyon

(57) ABSTRACT

A differential logic stage includes a precharge circuit, a first evaluate circuit and a second evaluate circuit. The precharge circuit is connected to a first potential and a differential output defined by a first output node and a second output node. The second evaluate circuit is connected to a second potential and a first output node. The second evaluate circuit is connected to the second potential and the second output node. The second evaluate circuit is symmetric with the first evaluate circuit, and in one embodiment each evaluate circuit includes a transistor stack and an input transistor. The transistor stack is connected between the second potential and one of the output nodes. The input transistor is connected in parallel with the transistor stack.

17 Claims, 4 Drawing Sheets

ZIPPER DOMINO CARRY GENERATE CELL FOR FAST ADDERS

BACKGROUND OF THE INVENTION

1. Technical Field

The present invention generally relates to semiconductor circuits. More particularly, the invention relates to differential domino logic stages for digital adders.

2. Discussion

Fundamental to the operation of virtually all digital microprocessors is the function of digital (i.e., binary) addition. Addition is used not only to provide numerical sums, but also in the implementation of numerous logic functions. In a typical microprocessor, many adders are used for these functions. When two digital words are added, the carry bit that results from the addition of lessor significant bits must be considered when adding more significant bits. The carry bit can easily be considered by rippling a carry signal through the entire addition chain as the addition is performed. A problem with such an approach, particularly for relatively large words (e.g., 64 bits) is that substantial time is required to ripple the carry signal. Since adders are often performing logic functions in critical time paths, the time needed to ripple the carry signal can slow up the microprocessor.

In response to the above concerns, techniques such as the static carry look-ahead (CLA) adder described in U.S. Pat. No. 5,847,984 to Mahurin have evolved. A difficulty associated with such a static adder, however, is that there typically is relatively high input loading on the circuit. High input loads can compromise speed. Domino circuits use clock signals to dynamically obtain "precharge" and "evaluation" phases for the domino circuits. These phases enable a reduction in input loading resulting in higher gain per stage and considerable speed increases. Two types of domino circuits are single ended and differential circuits. Single ended domino circuits use fewer transistors than the equivalent evaluate circuits, but require two stages of logic when constructing exclusive OR (XOR) gates. This characteristic can be important considering the fact that XOR gates are used in the fabrication of arithmetic logic units (ALUs). Domino circuits such as the p-type polysilicon (or metal oxide) semiconductor (PMOS) circuit 10 of FIG. 3 and the n-type polysilicon (or metal oxide) semiconductor (NMOS) circuit 12 of FIG. 4, on the other hand, are commonly referred to as differential domino circuits, and are more robust and faster than single ended domino circuits. An important characteristic of differential domino circuits is that they lend themselves to the implementation of XOR gates with one stage of logic.

Traditionally, each differential domino logic stage has a precharge circuit 14, a first evaluate circuit 16 and a second evaluate circuit 18. The precharge circuit 14 is connected to a first potential 20 and a differential output defined by a first output node 22 and a second output node 24. The first evaluate circuit 16 is connected to a second potential 26 and the first output node 22. The second evaluate circuit 18 is connected to the second potential 26 and the second output node 24. It is important to note that the first (or "true") evaluate circuit 16 and the second (or "not true") evaluate circuit 18 are not symmetric under the conventional approach. Simply put, input transistor T1 is in parallel with the transistor stack T2/T3, whereas input transistor T4 is not in parallel with the transistor stack T5/T6. This is because in an adder the first evaluate circuit 16 implements the expression $g_1 + p_1 g_0$, whereas the second evaluate circuit 18 implements the expression $g_{1n}(p_{1n} + g_{0n})$. Such an asymmetrical architecture can be more difficult to fabricate and does not allow the $g_{on}$ transistor (T6) to be connected directly to the output node.

BRIEF DESCRIPTION OF THE DRAWINGS

The various advantages of the present invention will become apparent to one skilled in the art by reading the following specification and appended claims, and by referencing the following drawings, in which:

DETAILED DESCRIPTION

Figure 1:
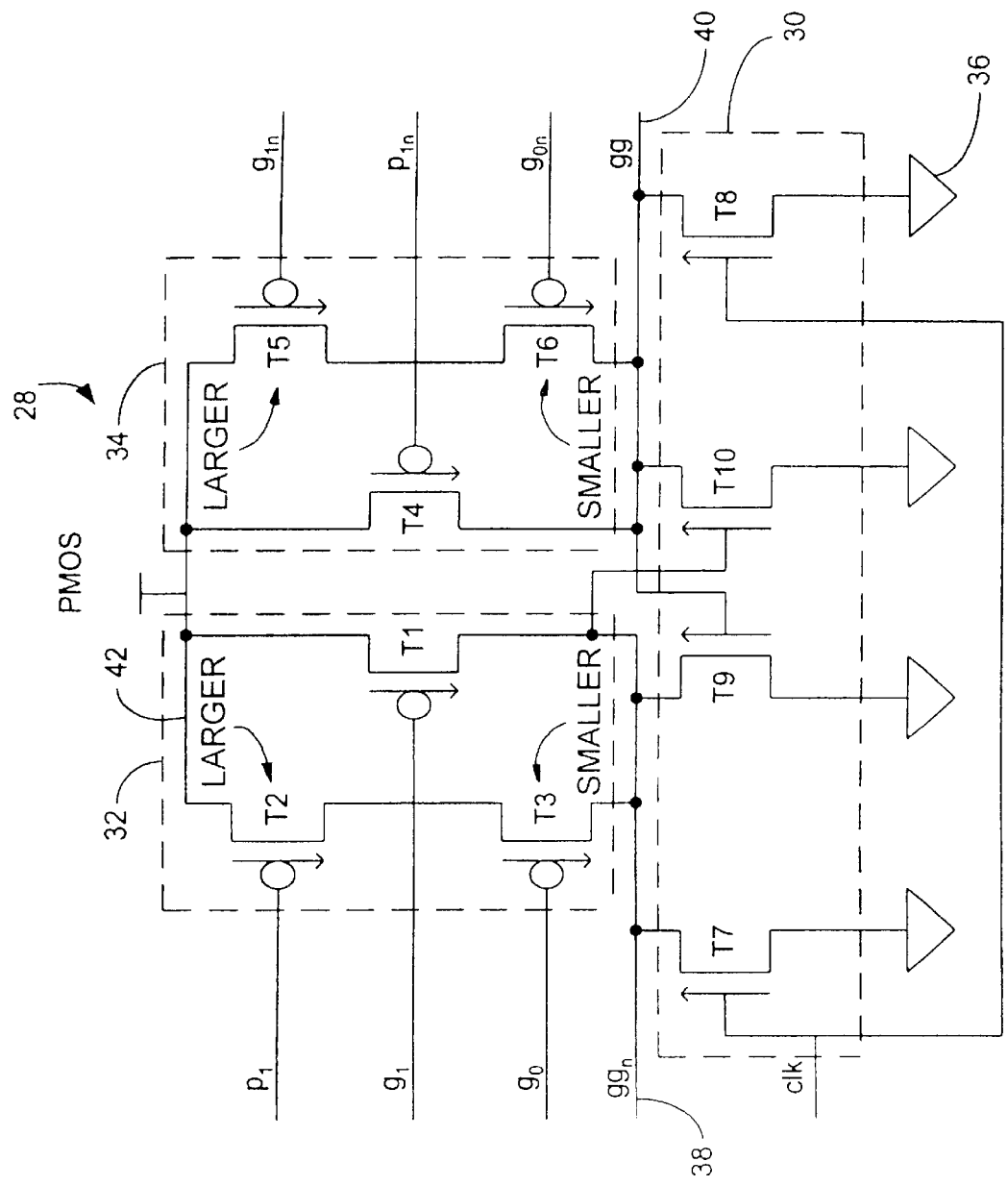
FIG. 1 is a transistor level diagram of an example of a logic stage in accordance with one embodiment of the present invention.

FIG. 1 shows a logic stage 28 utilizing p-type polysilicon (or metal oxide) semiconductor (PMOS) technology. The PMOS logic stage 28 generally has a precharge circuit 30, a first evaluate circuit 32 and a second evaluate circuit 34. As will be discussed in greater detail below, the PMOS logic stage 28 is commonly referred to as a differential domino circuit and has significant advantages over similar evaluate circuits and single ended domino circuits as already discussed. While the logic stage 28 will be primarily discussed with regard to carry look ahead (CLA) adders, the invention is not so limited. In fact, the principles described herein can be beneficial to any circuit in which speed and performance are issues of concern. Notwithstanding, there are a number of aspects of CLA adders for which the logic state 28 is uniquely suited.

It can generally be seen that the precharge circuit 30 is connected to a first potential 36 and a differential output defined by a first output node 38 and a second output node 40. In the illustrated embodiments, the output nodes 38, 40 correspond to a group generate output for a range of bits defined by a less significant bit and a more significant bit. The first evaluate circuit 32 is connected to a second potential 42 and the first output node 38. The second evaluate circuit 34 is connected to the second potential 42 and the second output node 40. It is important to note that the second evaluate circuit 34 is symmetric with the first evaluate circuit 32. In particular, it can be seen that the second evaluate circuit 34 implements the expression $p_{1n} + g_{1n} g_{0n}$ as opposed to the traditional expression $g_{1n}(p_{1n} + g_{0n})$. This is possible by making use of the fact that the traditional expression can be expanded to $g_{1n} p_{1n} + g_{1n} g_{0n}$ and the fact that when $P_{1n}$ is low $g_{1n}$ is also low. Thus, $g_{1n}$ can be eliminated from the first term of the traditional expression to obtain the expression implemented by second evaluate circuit 34 of PMOS logic stage 28.

It can be therefore be seen that each evaluate circuit 32, 34 includes a transistor stack connected between the second potential 42 and one of the output nodes 38, 40. Each evaluate circuit 32, 34 also includes an input transistor connected in parallel with the transistor stack. Specifically, the first evaluate circuit 32 has a transistor stack T2/T3 connected between the second potential 42 and output node 38. Input transistor T1 is connected in parallel with the transistor stack T2/T3. Similarly, the second evaluate circuit 34 has transistor stack T5/T6 connected between the second potential 42 and the output node 40. Input transistor T4 is connected in parallel with the transistor stack T5/T6.

Each transistor stack includes a first series transistor connected to the second potential 42 and a second series transistor connected between the first series transistor and one of the output nodes 38, 40. In one embodiment, the first series transistor is larger than the second series transistor in order to achieve a "tapering" effect. By tapering the series transistors, a number of benefits can be achieved. For example, one benefit is the ability to place the smaller transistor in the critical path of the adder. This benefit is particularly important with regard to the second series transistior T6 of the second evaluate circuit 34. Specifically, it should be noted that in standard CLA architectures, the $g_{0n}$ signal is in the critical path. By using transistor T6 to receive the generate input corresponding to the less significant bit ($g_{on}$) of the adder circuit, the input load can be reduced, which speeds up the critical path. Thus, the input load of T6 can be reduced because the T5/T6 transistor stack is tapered such that T5 is larger than T6. Simply put, the $g_{on}$ transistor T6 is moved closer to the output to obtain speed and performance benefits. Furthermore, the input transistor T4 of the second evaluate circuit 34 is no longer stacked and can also be reduced in size. Such speed reductions speed up the propagate path which in turn, speed up the generate path.

Returning now to FIG. 2, it can be seen that similar benefits can be achieved with an n-type polysilicon (or metal oxide) semiconductor (NMOS) logic stage 28'. The above discussion therefore applies with the caveat that in the NMOS logic stage 28', the first potential 36' is greater than the second potential 42', whereas for the PMOS logic stage 28 the first potential 36 is less than the second potential 42. Thus, logic stage 28' includes a precharge circuit 30', a first evaluate circuit 32', and a second evaluate circuit 34', wherein the evaluate circuits 32', 34' are symmetric. As already discussed, the second series transistor T6' is to receive a generate input corresponding to a less significant bit, whereas the first series transistor T5' and the input transistor T4' are to receive inputs corresponding to a more significant bit. Transistor T6' is connected directly to output node 40' to obtain the tapering benefits already discussed. Furthermore, transistor T4' is connected directly between the output node 40' and second potential 42' in order to speed up the propagate path.

Figure 2:
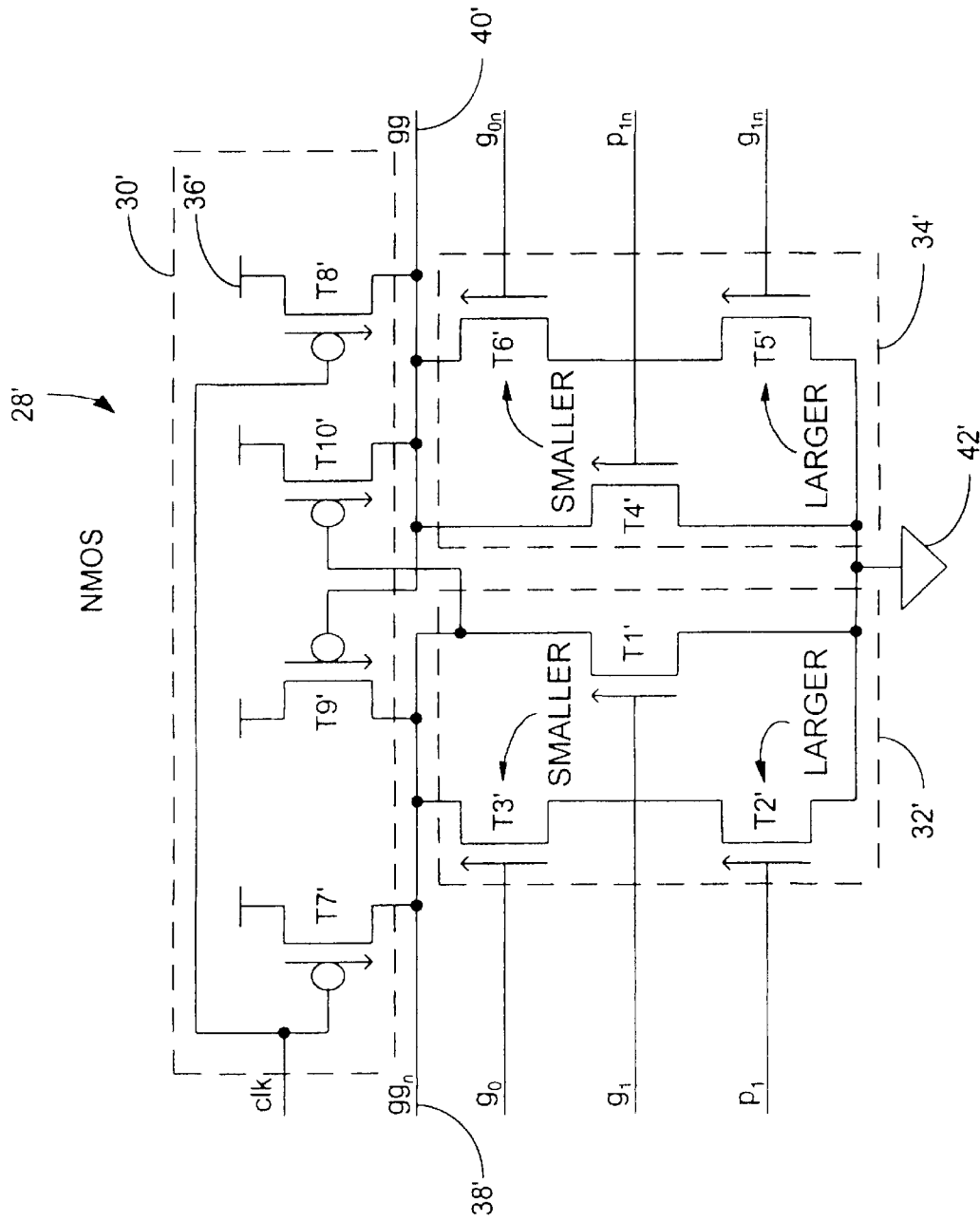
FIG. 2 is a transistor level diagram of an example of a logic stage in accordance with an alternative embodiment of the present invention.
Figure 3:
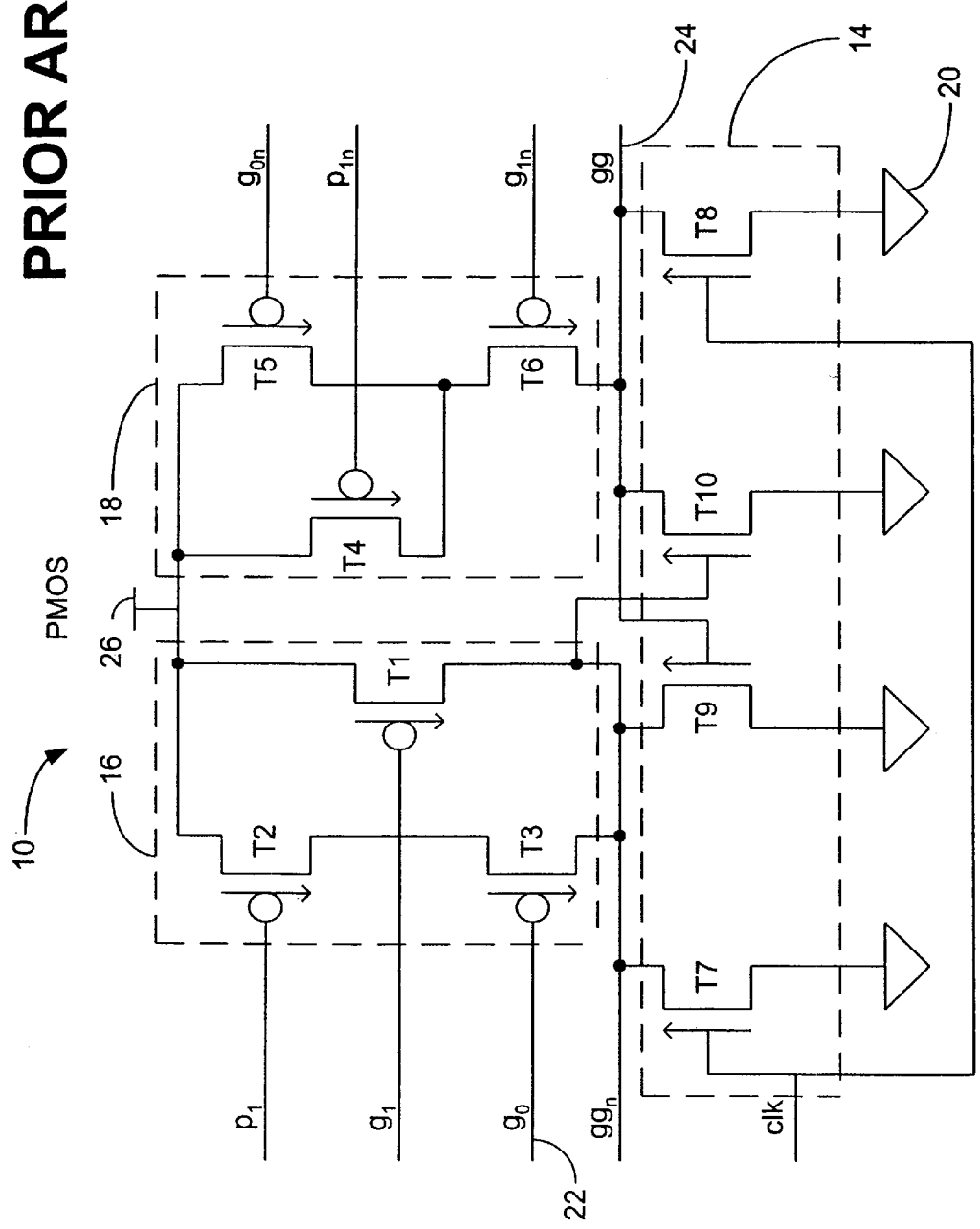
FIG. 3 is a transistor level diagram of an example of a conventional logic stage useful in understanding the invention.
Figure 4:
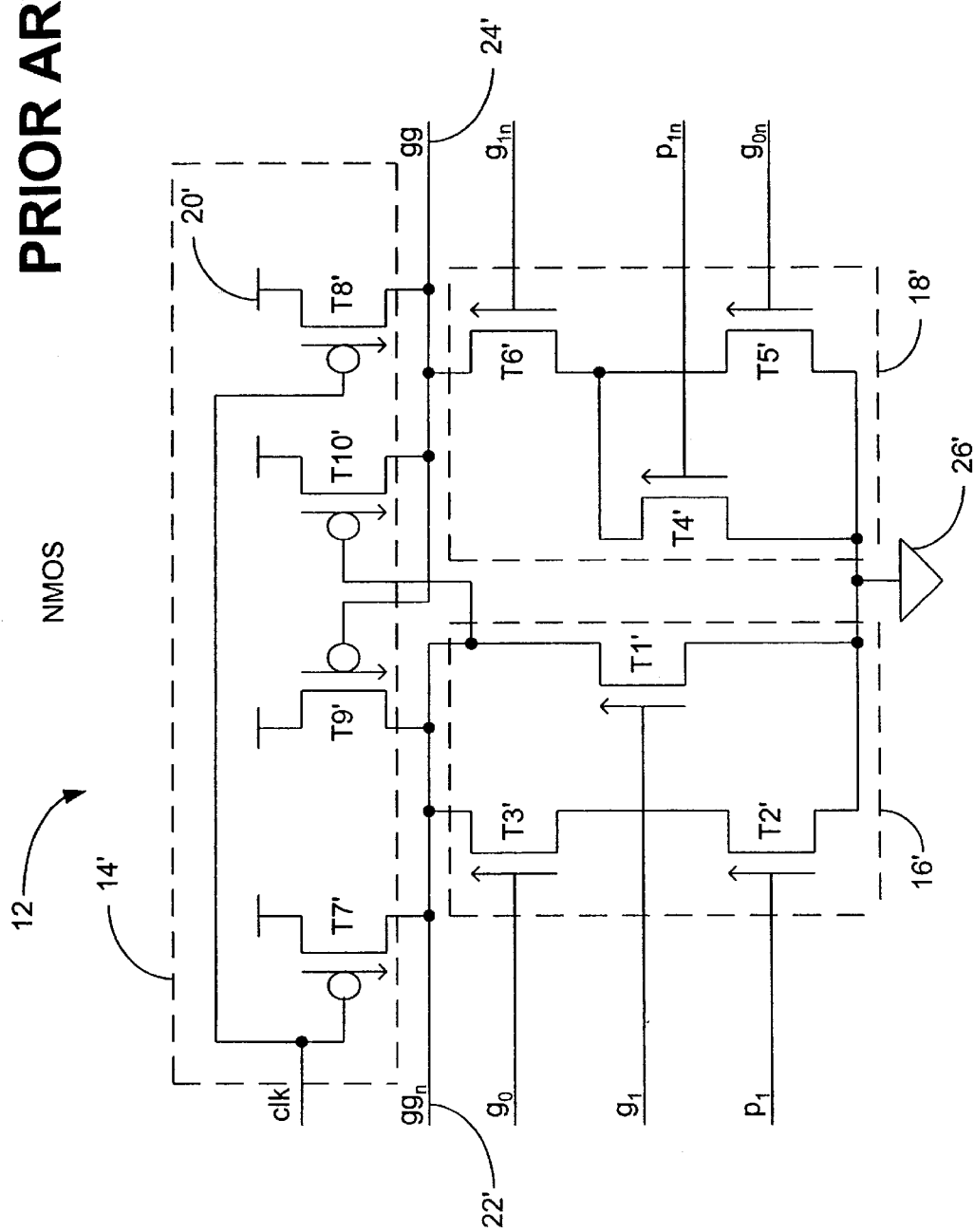
FIG. 4 is a transistor level diagram of an alternative conventional logic stage, useful in understanding the invention.

With continuing reference to FIGS. 1 and 2, it can be seen that the precharge circuit 30 includes a pair of clocked transistors T7, T8 to receive a clock input. The clocked transistors T7, T8 define an evaluate phase and a precharge phase for the logic stage 28 based on the clock input. The precharge circuit 30 further includes a pair of cross-coupled keeper transistors T9, T10 to hold data at the output nodes 38, 40. Precharge circuits such as those shown are well understood as evidenced by the discussion in U.S. Pat. No. 6,205,463 to Manglore et al.

The logic stages described herein can be used to construct adders that are faster, more robust and less difficult to manufacture. For example, by alternating PMOS and NMOS logic stages with relatively fast clock inverters disposed between the stages, XOR functions can be performed more easily and critical paths are significantly reduced.

Those skilled in the art can now appreciate from the foregoing description that the broad techniques of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

I claim:

1. A logic stage comprising:
    a precharge circuit connected to a first potential and a differential output defined by a first output node and a second output node;
    a first evaluate circuit connected to a second potential and the first output node; and
    a second evaluate circuit connected to the second potential and the second output node, the second evaluate circuit being symmetric with the first evaluate circuit, each evaluate circuit including a transistor stack connected between the second potential and one of the output nodes, and an input transistor connected in parallel with the transistor stack, each transistor stack including a first series transistor connected to the second potential, and a second series transistor connected between the first series transistor and one of the output nodes, the first series transistor being larger than the second series transistor.

2. The logic stage of claim 1 wherein the evaluate circuits include PMOS transistors.

3. The logic stage of claim 2 wherein the first potential is less than the second potential.

4. The logic stage of claim 1 wherein the evaluate circuits include NMOS transistors.

5. The logic stage of claim 4 wherein the first potential is greater than the second potential.

6. The logic stage of claim 1 wherein the precharge circuit includes a pair of clocked transistors to receive a clock input, the clocked transistors defining an evaluate phase and a precharge phase for the logic stage based on the clock input.

7. The logic stage of claim 1 wherein the precharge circuit includes a pair of cross-coupled keeper transistors to hold data at the output nodes.

8. Implemented in a differential domino logic stage having a precharge circuit and a true evaluate circuit, a not true evaluate circuit comprising:
    a transistor stack connected between a potential and one of a pair of output nodes, the transistor stack to receive a not true generate input corresponding to a less significant bit of an adder circuit and a not true generate input corresponding to a more significant bit; and
    an input transistor connected in parallel with the transistor stack, the input transistor to receive a not true propagate input corresponding to the more significant bit.

9. The not true evaluate circuit of claim 8 wherein the not true generate input corresponding to the less significant bit is located in a path that is more critical than a path including the not true generate input corresponding to the more significant bit.

10. The not true evaluate circuit of claim 8 wherein the transistor stack includes:
    a first series transistor connected to the potential; and
    a second series transistor connected between the first series transistor and one of the output nodes.

11. The not true evaluate circuit of claim 10 wherein the first series transistor is larger than the second series transistor.

12. The not true evaluate circuit of claim 8 wherein the output nodes correspond to a group generate output for a range of bits defined by the less significant bit and the more significant bit.

13. The not true evaluate circuit of claim 8 including PMOS transistors.

14. The not true evaluate circuit of claim 8 including NMOS transistors.

15. A logic stage comprising:
- a precharge circuit connected to a first potential and a differential output defined by a first output node and a second output node;
- a first evaluate circuit connected to a second potential and the first output node; and
- a second evaluate circuit connected to the second potential and the second output node, the second evaluate circuit being symmetric with the first evaluate circuit, each evaluate circuit including a transistor stack connected between the second potential and one of the output nodes, and an input transistor connected in parallel with the transistor stack, each transistor stack including a first series transistor connected to the second potential, and a second series transistor connected between the first series transistor and one of the output nodes, the second series transistor to receive a signal that is located in a path that is more critical than a path including a signal received by the first series transistor.

16. The logic stage of claim 15 wherein the second series transistor is to receive a generate input corresponding to a less significant bit, the first series transistor and input transistor to receive inputs corresponding to a more significant bit.

17. The logic stage of claim 16 wherein the output nodes correspond to a group generate output for a range of bits defined by the less significant bit and the more significant bit.

\* \* \* \* \*